United States Patent
Schmidt

(10) Patent No.: US 7,643,814 B2
(45) Date of Patent: Jan. 5, 2010

(54) RECEPTION ARRANGEMENT WITH PREAMPLIFIER CIRCUIT

(75) Inventor: Axel Schmidt, Wunstorf (DE)

(73) Assignee: Infineon Technologies AG, Munich (DE)

( * ) Notice: Subject to any disclaimer, the term of this patent is extended or adjusted under 35 U.S.C. 154(b) by 567 days.

(21) Appl. No.: 11/065,533

(22) Filed: Feb. 24, 2005

(65) Prior Publication Data
US 2005/0197087 A1 Sep. 8, 2005

Related U.S. Application Data

(63) Continuation of application No. PCT/DE03/02773, filed on Aug. 20, 2003.

(30) Foreign Application Priority Data
Aug. 29, 2002 (DE) .................... 102 39 854

(51) Int. Cl.
*H04B 1/10* (2006.01)
(52) U.S. Cl. ........................ 455/311; 455/333; 455/341; 330/275; 330/301
(58) Field of Classification Search .................. 455/83, 455/311, 333, 341; 330/275, 301
See application file for complete search history.

(56) References Cited
U.S. PATENT DOCUMENTS 5,930,692 A * 7/1999 Peterzell et al. ............. 455/217
6,744,322 B1 * 6/2004 Ma et al. .................... 330/300
6,909,882 B2 * 6/2005 Hayashi et al. ............... 455/84
2002/0025785 A1 * 2/2002 Satoh et al. .................. 455/78

FOREIGN PATENT DOCUMENTS

| GB | 2 277 650 A | 11/1994 |
| JP | 05055841 A | 3/1993 |
| JP | 2002135066 A | 5/2002 |
| WO | WO 02/15397 A2 | 2/2002 |

OTHER PUBLICATIONS

International Search Report, Int'l Filing No. PCT/DE03/02773, Int'l Filing date Aug. 20, 2003, 1 pg.

* cited by examiner

*Primary Examiner*—Edward Urban
*Assistant Examiner*—Christian A Hannon
(74) *Attorney, Agent, or Firm*—Eschweiler & Associates, LLC

(57) ABSTRACT

The invention relates to a preamplifier circuit with at least one transistor that couples a signal input to a signal output. The signal input is supplied with a radio-frequency signal. In addition, the preamplifier circuit includes a switch that switchably couples the input to a reference potential and which, when the preamplifier is inactive, is closed. Hence, when the preamplifier is inactive, the input is put into a low-impedance state and the amplifier and downstream assemblies are protected from unwanted high-power interference signals. It is thus also possible to use other, fully integratable filter types in a transceiver's reception signal processing chain instead of external surface acoustic wave filters with a low level of complexity and without drawbacks.

12 Claims, 1 Drawing Sheet

RECEPTION ARRANGEMENT WITH PREAMPLIFIER CIRCUIT

REFERENCE TO RELATED APPLICATIONS

This application is a continuation of PCT/DE03/02773, filed Aug. 20, 2003, which was not published in English, which claims the benefit of the priority date of German Patent Application No. DE 102 39 854.2, filed on Aug. 29, 2002, the contents of which both are herein incorporated by reference in their entireties.

FIELD OF THE INVENTION

The present invention relates to a reception arrangement with a preamplifier circuit.

BACKGROUND OF THE INVENTION

In radio-frequency applications, for example in mobile radio, low noise preamplifiers are normally used at the input of a receiver's signal processing chain. Low noise preamplifiers are also referred to as LNAs (Low Noise Amplifiers). Such low noise preamplifiers provide a sufficiently high signal-to-noise ratio (SNR) for downstream signal processing blocks while contributing little noise.

Radio-frequency receivers with an LNA of this type are normally developed by adding a transmission path to produce "transceivers". Hence, bidirectional transmission of data, for example of voice data, is possible.

In line with the mobile radio standard GSM (Global System for Mobile communication), for example, sending and receiving take place alternately. Since this alternate sending and receiving takes place without being noticed by the user, however, GSM mobile radios are nevertheless referred to as full duplex systems.

When a transceiver of this type is being used for useful data transmission with an active transmission path, then it is necessary to ensure that the input power applied to the input of the reception path, which is turned off, is not too high. This can firstly result in interference signals in the transmission spectrum but could secondly also result in premature ageing through to destruction of the nonactive input transistors in the low noise preamplifier in the receiver. For this reason, the input transistors in the nonactive amplifiers are turned off when the receiver is inactive, since they are not needed and furthermore the current drawn by such transceivers is normally a significant factor, particularly for use in mobile radio.

One possible way of ensuring sufficient attenuation of the transmission spectrum for the inputs of the preamplifier in the reception path is to connect external surface acoustic wave filters upstream of the preamplifier. These surface acoustic wave filters are often present anyway in order to ensure adequate channel selection in the reception path.

However, external surface acoustic wave filters represent a relatively high level of complexity for transceiver units which are otherwise designed largely using integrated circuitry, which means that a sufficiently high level of insulation between the reception path and an active transmission path is wanted even when individual external SAW filters are dispensed with. The aim is to be able to use chip modules which have a plurality of SAW filters integrated in them.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present one or more concepts of the invention in a simplified form as a prelude to the more detailed description that is presented later.

The present invention is directed to a reception arrangement with a preamplifier circuit which, given a reduced number of components, prevents premature ageing or destruction of nonactive transistors in the preamplifier in the reception signal chain as a result of interference signals.

The preamplifier, which is particularly suitable for use in reception paths in mobile radios, uses at least one transistor to amplify a radio-frequency useful signal which is supplied at its signal input. This amplified signal derived from the useful signal is provided at the transistor's signal output. The first and second connections of the switch couple the signal input of the transistor to a reference potential connection.

The switch is closed while the preamplifier is in an inactive state. In this case, the inactive state is defined, in particular, as being when no useful signal needs to be received or amplified. In a normal useful signal reception mode in the amplifier, on the other hand, the switch at the signal input of the transistor is open.

Closing the switch puts the useful signal input of the transistor and hence of the preamplifier at a reference potential. The signal input accordingly changes to low impedance. If an interference signal, possibly at high power, is now applied to the input of the preamplifier, then the low impedance of the input means that this high power results merely in a very slight voltage swing. This advantageously ensures that the transistor in an inactive reception path's preamplifier does not age prematurely as a result of interference signals. In addition, the transmission spectrum is not degraded.

In this case, suitable reference potentials which may be used are not just ground potential, but also other reference potentials Since the preamplifier is thus easily protected from interference signals, even at high power, the present invention makes it possible to dispense with individual external surface acoustic wave filters connected upstream of the preamplifier. By way of example, instead of individual external surface acoustic wave filters it is now possible to use "filter modules" which have a plurality of SAW filters integrated therein and which have lower attenuation than individual external surface acoustic wave filters. In particular, the present invention allows reception arrangements to be produced with a significantly reduced number of requisite components or chips and hence less expensively without any drawbacks.

In accordance with one embodiment of the invention, the preamplifier comprises a balanced amplifier. In this case, there are a first and a second transistor with a respective input connection which together form a balanced signal input for supplying a differential, radio-frequency useful signal. The output connections of the first and second transistors form the balanced signal output. The first and second transistors are preferably coupled to one another, for example at a respective third connection on the transistors.

In one example, where the transistors are in the form of bipolar transistors, which have the advantage of particularly good radio-frequency properties, a common emitter node is formed.

The switch, provided in line with the present invention, for connecting the signal input to a reference potential, and hence for switching the signal input to low impedance, is preferably in a form such that each amplifying transistor has a respective associated switch which puts the respective input connection at the reference potential when the preamplifier is in an inactive state.

In one example, a means for activating or turning on the preamplifier is provided. The means for activating the preamplifier, in one example, comprises a further switch.

In this case, the first and second switches are opened, for example using a control circuit, at the point at which the means for activating the preamplifier is used to activate the latter, that is to say to turn it on, and vice versa.

The transistor or transistors in the low noise preamplifier comprise, in one example, bipolar transistors. Alternatively, the circuit may also be integrated using complementary metal oxide semiconductor circuitry.

The reception arrangement with a preamplifier circuit as described above comprises a means for inputting a radio-frequency signal, and a bandpass filter with an input coupled to the means for inputting a radio-frequency signal, and with an output. The preamplifier circuit has a signal input connected to the output of the bandpass filter, and a down-conversion frequency mixer with a useful signal input coupled to the signal output of the preamplifier, a local oscillator signal input, and an output for tapping off a down-converted signal. The arrangement further comprises a control input coupled to the control input of the preamplifier, and configured to close a switch between a signal input of a transistor and a reference potential of the preamplifier circuit when no useful signal is being received.

Particularly when the received path is not active, coupling the transmission path to the reception path via a duplex unit applies a relatively high input power in the form of an interference signal to the input of the reception signal chain.

Since, in line with the present invention, the switch at the signal input of the transistor in the preamplifier is used to make this signal input on the preamplifier low impedance while the preamplifier is not active, the high power of the input signal advantageously results only in a very slight voltage swing.

The reduced voltage swing ensures that little or no coupling to the transmit path occurs. Consequently, input transistors in the preamplifier and downstream components are not damaged by premature ageing.

A further advantage is obtained when using the invention in transceivers with two or more reception paths. Such multimode receivers may be designed to have, by way of example, a reception path for phase and frequency modulation and a further reception path for amplitude modulation. In line with the proposed invention, the insulation between an active reception path and a nonactive reception path is significantly increased. If there is insufficient insulation between two reception paths where only one of which is in operation, on the other hand, the respective active path's ability to withstand high-level signals would be undesirably reduced, which is successfully avoided in the present case.

In particular, the present invention also allows the use of integrated filters or modular filters with lower attenuation instead of external surface acoustic wave filters connected upstream of the preamplifier.

Between the output connections of the preamplifier transistors and the radio-frequency mixer there may be a respective cascade transistor for forming a cascade circuit. This achieves a further increase in the insulation.

An additional amplifier stage may be inserted between the low noise preamplifier and the mixer.

To the accomplishment of the foregoing and related ends, the invention comprises the features hereinafter fully described and particularly pointed out in the claims. The following description and the annexed drawings set forth in detail certain illustrative aspects and implementations of the invention. These are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF THE DRAWINGS

The invention is explained in more detail below using a plurality of exemplary embodiments with reference to the drawings, in which.

DETAILED DESCRIPTION OF THE INVENTION

Figure 1:
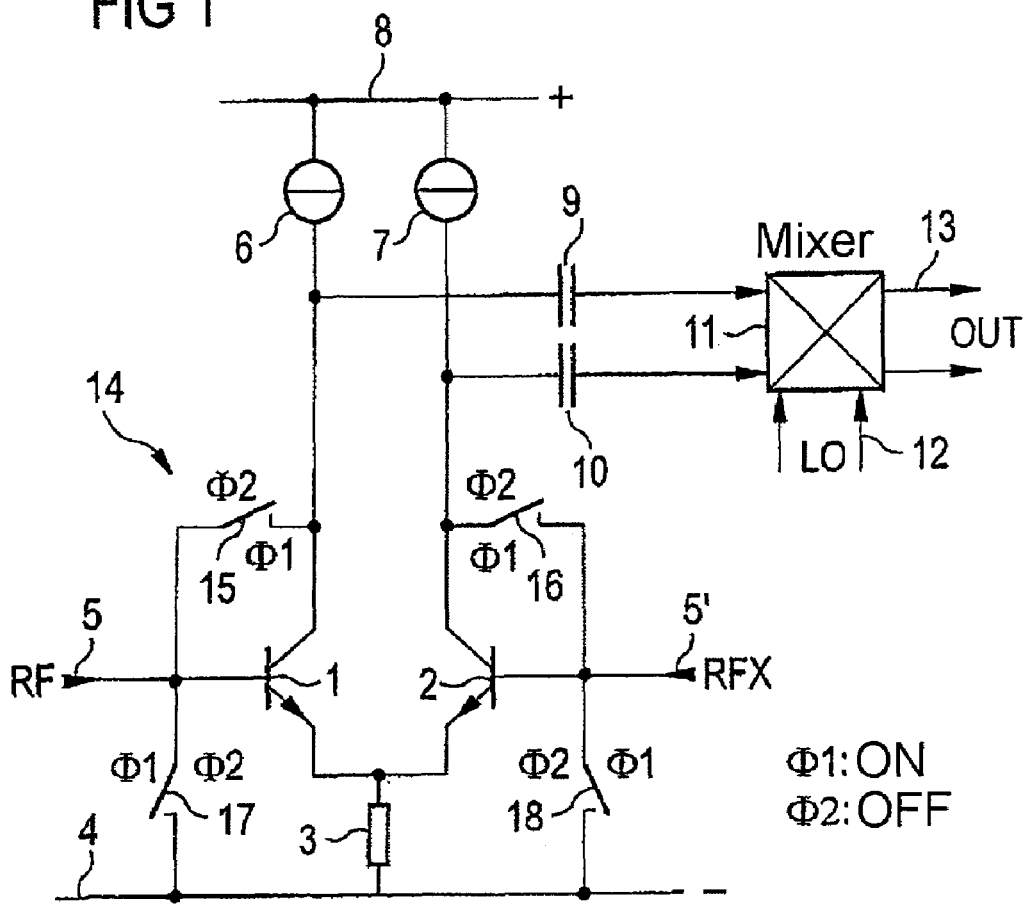
FIG. 1 is a circuit diagram illustrating an exemplary preamplifier with a downstream radio-frequency mixer.

FIG. 1 shows a preamplifier circuit of balanced design which is produced using bipolar circuitry. The preamplifier circuit comprises a first and a second bipolar transistor, whose emitters are coupled to one another in order to form a differential amplifier. The first and second transistors 1, 2 have their common emitter node connected to a reference potential connection 4 via a resistor 3. The two base connections of the transistors 1, 2 form the signal input 5, 5' of the transistors 1, 2 and hence also the signal input of the preamplifier. The collector connections of the transistors 1, 2 are connected to a supply potential connection 8 via a respective current source 6, 7. The collector connections of the transistors 1, 2 form the signal output of the preamplifier for the purpose of providing an amplified signal derived from the useful signal and are connected to the balanced input of a radio-frequency down-conversion mixer 11 via a respective coupling capacitance 9, 10.

The radio-frequency down-conversion mixer 11 also has a balanced local oscillator signal input 12 and an output 13 at which a down-converted signal is provided. The preamplifier 1 to 8, which has been provided with reference symbol 14 in the present case, is used to preamplify a radio-frequency, balanced signal.

To turn on the preamplifier, a switch pair 15, 16 is provided. The switch 15 connects the base connection of the first transistor 1 to its collector connection. The switch 16 connects the base connection of the second transistor 2 to its collector connection. The switches 15, 16 are respectively turned on and off concurrently. The turned-on state of the switches 15, 16 is denoted by $\Phi 1$, and the turned-off state is denoted by $\Phi 2$. Closing the switches 15, 16 accordingly causes the preamplifier to turn on. Opening the switches 15, 16 turns off the preamplifier. The switches 15, 16 are preferably actuated by means of a control unit (not shown here) on the basis of the presence of a radio-frequency useful signal which is to be amplified.

In addition to the switches 15, 16, there is a switch pair 17, 18 for switching the input terminals 5, 5' to low impedance when the preamplifier is inactive or turned off. The switches 17, 18 connect the input terminals 5, 5' to reference potential connection 4 such that they can respectively be connected and disconnected. While the preamplifier 14 is in a turned-on state $\Phi 1$, the switches 17, 18 are open. If the preamplifier is in the turned-off state $\Phi 2$, however, then the switches 17, 18 are closed and hence the inputs 5, 5' are at low impedance.

The very low input impedance of the inputs of the nonactive preamplifier means that any high signal power which is applied to this input results in only a small voltage swing. This prevents the input transistors 1, 2 in the preamplifier and also downstream assemblies from being destroyed or damaged or changing to an undesirable state.

Filters having lower attenuation can now be used at the input of the preamplifier, since the adequate suppression of interference signals can take place in the preamplifier itself.

The actuation of the switches 15 to 18 in the turned-on and turned-off states Φ1, Φ2 is shown and described in exactly opposite directions, that is to say that the switches 17, 18 are closed when the switches 15, 16 are open, and vice versa. However, it may make sense, depending on the application and within the context of the invention, to observe particular non-overlap times for the switches, for example to ensure that at no time are all switches closed or all switches open, according to the demands of the application and the properties of the components used.

Figure 2:
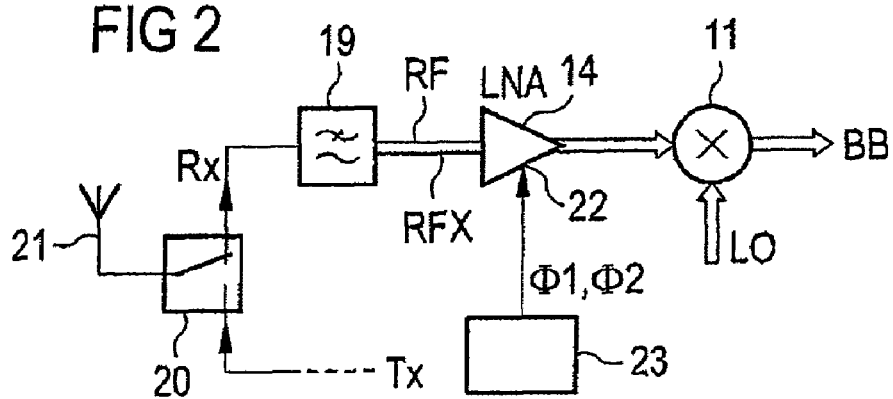
FIG. 2 is a block diagram illustrating an exemplary application of the preamplifier of FIG. 1 in the reception path of a mobile radio transceiver.

FIG. 2 shows an exemplary application of the preamplifier 14 as a low noise preamplifier in the reception signal chain Rx of a mobile radio transceiver. As in FIG. 1, the low noise preamplifier 14 has a down-conversion frequency mixer 11 connected downstream of it which converts a preamplified, received radio-frequency signal RF into a baseband signal BB or into an intermediate-frequency signal using a carrier signal or local oscillator signal LO. The input of the preamplifier 14 has a bandpass filter 19 connected to it which may also be developed as a bandpass filter in alternative embodiments. The filter 19 is in the form of a surface acoustic wave filter or SAW filter. The input of the SAW filter 19 is connected to a duplex unit 20 which couples the reception path Rx, a transmission path Tx and an antenna 21 to one another. The control input 22 of the low noise preamplifier 14 has a control circuit 23 connected to it, designed to change over between a turned-on state Φ1 and a turned-off state Φ2 for the preamplifier 14.

When the transmission path Tx in the transceiver is active, the duplex unit 20 may be subject to high signal levels which, depending on the design of the duplex unit as a switch or filter arrangement, may show through as relatively high signal levels in the reception path. The protection of the inputs of the preamplifier 14 using the switches 17, 18 with a low input impedance, which is an inherent part of the present invention, means that it is advantageously possible to use a surface acoustic wave filter 19 or another filter with lower attenuation and signal selection.

The present invention thus also allows the use of integrated surface acoustic wave filters or modular filters with lower attenuation and lower complexity instead of external surface acoustic wave filters with high signal selection and high attenuation.

The present invention provides an assurance that the reception path cannot be coupled to the transmission path, and the input transistors in the reception path which is not active at present cannot be destroyed.

The present invention can be implemented with particularly low complexity in this context, since this preamplifier 14 merely needs to have two switches 17, 18 added to it. In this case, the switches 17, 18 may be in the form of transistor switches, for example.

It is naturally also within the scope of the invention for the preamplifier described, with the signal input which can be switched to a low-impedance state, also to be applied to other assemblies instead of radio-frequency mixers.

While the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

The invention claimed is:

1. A reception arrangement, comprising:
a means for receiving a radio-frequency signal;
a preamplifier circuit comprising a transistor having a signal input configured to receive the radio-frequency signal from the receiving means, the transistor further having a terminal comprising a signal output configured to provide an amplified signal derived from the radio-frequency signal, the preamplifier circuit further comprising a current path between the signal input and a reference potential, wherein the current path comprises a switch comprising a control input configured to close the switch when the preamplifier circuit is in an inactive state; and
a down-conversion frequency mixer having a useful signal input coupled to the signal output of the preamplifier, a local oscillator signal input, and an output configured to provide a down-converted signal based on the amplified signal and the local oscillator signal,
wherein the preamplifier circuit comprises, in addition to the transistor which comprises a first transistor, a second transistor coupled to the first transistor, wherein the first and second transistors together are configured to form a balanced amplifier having a balanced signal input and a balanced signal output, and wherein the switch comprises a first switch, the preamplifier circuit further comprising a second switch coupled between a signal input of the second transistor and the reference potential, the second switch comprising a control input configured to close the second switch when the preamplifier is in the inactive state.

2. The reception arrangement of claim 1, further comprising a means for activating the preamplifier circuit.

3. The reception arrangement of claim 1, wherein the signal input of the transistor comprises a base terminal when the transistor comprises a bipolar transistor or a gate terminal when the transistor comprises a MOS transistor.

4. The reception arrangement of claim 3, wherein the means for activating the preamplifier comprises a switch coupled between the base terminal and a collector terminal when the transistor comprises a bipolar transistor or between the gate terminal and a drain terminal when the transistor comprises a MOS transistor.

5. The reception arrangement of claim 1, further comprising a duplex unit having an output coupled to a reception path comprising an input of a bandpass filter that in turn is coupled to the preamplifier circuit, and having an input coupled to a transmission path for transmitting a radio-frequency signal, and having a connection coupled to the means for receiving the radio-frequency signal, wherein the duplex unit is operable to selectively couple the receiving means to one of the reception path and the transmission path.

6. The reception arrangement of claim 1, further comprising a control circuit connected to the preamplifier circuit and configured to selectively turn on and turn off the preamplifier circuit based on a presence of a radio-frequency signal.

7. The reception arrangement of claim 1, further comprising a bandpass filter having an input coupled to the receiving means and an output coupled to the signal input of the transistor of the preamplifier circuit.

8. A receiver circuit, comprising:
an antenna configured to receive a radio-frequency signal;
a preamplifier circuit coupled to the antenna and operable to generate an amplified radio-frequency signal at an output thereof that is a function of the radio-frequency signal at an input thereof, wherein the preamplifier is configured to selectively reduce an input impedance at the radio-frequency signal input when the preamplifier circuit is in an inactive state, wherein the preamplifier circuit comprises:
a transistor having a control terminal configured to receive the radio-frequency signal, and having an output terminal configured to output the amplified radio-frequency signal;
a first switching circuit coupled between the transistor control terminal and a reference potential, wherein the first switching circuit is configured to couple the control terminal to the reference potential when the preamplifier circuit is in the inactive state, thereby reducing an input impedance of the preamplifier circuit in the inactive state; and
a second switching circuit coupled between the control terminal and the preamplifier circuit output, wherein the second switching circuit is configured to selectively couple the control terminal to the output when the preamplifier circuit is in an active state; and
a mixer circuit operable to receive the amplified radio-frequency signal and down-convert the amplified radio-frequency signal to a baseband signal.

9. The receiver circuit of claim 8, further comprising:
a duplex unit coupled between the antenna and the preamplifier circuit, wherein the preamplifier circuit resides in a reception path; and
a transmission path coupled to the duplex unit,
wherein the duplex unit is configured to selectively couple one of the reception path and the transmission path to the antenna.

10. A half-duplex transceiver arrangement, comprising:
an antenna operable to receive and transmit a radio-frequency signal;
a duplex unit coupled to the antenna and operable to selectively couple the antenna to one of a reception path and a transmission path;
a preamplifier circuit arranged in the reception path, and configured to convert a received radio-frequency signal to an amplified radio-frequency signal in an active state, and generate a low impedance at an input thereof in an inactive state, wherein the preamplifier circuit comprises:
a transistor having a control terminal forming an input of the preamplifier circuit, and having a terminal forming an output of the preamplifier circuit; and
an impedance transformation switch coupled between the control terminal and a reference potential, wherein when the impedance transformation switch is closed in the inactive state of the preamplifier circuit, the input impedance of the preamplifier circuit is substantially reduced; and
a mixer circuit configured to down-convert the amplified radio-frequency signal to a baseband signal.

11. The half-duplex transceiver arrangement of claim 10, further comprising a bandpass filter coupled between the duplex unit and the preamplifier circuit in the reception path, and configured to eliminate selected frequency components of the radio-frequency signal received from the antenna.

12. The half-duplex transceiver arrangement of claim 10, wherein the preamplifier circuit comprises:
a transistor having a control terminal forming an input of the preamplifier circuit, and having a terminal forming an output of the preamplifier circuit; and
an activation switch coupled between the terminal and the control terminal of the transistor, wherein when the activation switch is closed, the preamplifier circuit is in the active state, and wherein when the activation switch is open the preamplifier circuit is in the inactive state.

* * * * *